(12) United States Patent
Takagi

(10) Patent No.: US 7,215,555 B2
(45) Date of Patent: May 8, 2007

(54) BUS BAR STRUCTURE PLATE AND PRODUCING METHOD OF CIRCUIT STRUCTURE BODY BY USING OF THE SAME

(75) Inventor: Kouichi Takagi, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 313 days.

(21) Appl. No.: 10/796,983

(22) Filed: Mar. 11, 2004

(65) Prior Publication Data

US 2004/0242086 A1 Dec. 2, 2004

(30) Foreign Application Priority Data

Mar. 12, 2003 (JP) ............................. 2003-066253

(51) Int. Cl.
*H01R 9/00* (2006.01)

(52) U.S. Cl. .................. 361/775; 361/772; 361/781; 361/776; 361/783; 361/760; 361/600; 361/626

(58) Field of Classification Search .............. 361/775, 361/772, 781, 776, 783, 626
See application file for complete search history.

(56) References Cited

U.S. PATENT DOCUMENTS

| | | | | |
|---|---|---|---|---|
| 4,471,158 A | * | 9/1984 | Roberts ..................... 174/52.4 |
| 5,023,752 A | * | 6/1991 | Detter et al. ................. 361/752 |
| 5,928,004 A | * | 7/1999 | Sumida et al. ............. 439/76.2 |
| 6,116,916 A | * | 9/2000 | Kasai ......................... 439/76.2 |
| 6,315,578 B1 | * | 11/2001 | Kasai et al. ............... 439/76.2 |
| 6,466,451 B2 | * | 10/2002 | Mizuno et al. ............ 361/796 |
| 6,472,772 B2 | * | 10/2002 | Onizuka et al. .......... 307/10.1 |
| 6,541,700 B2 | * | 4/2003 | Chiriku et al. ................ 174/50 |
| 6,600,658 B2 | * | 7/2003 | Iwata .......................... 361/752 |
| 6,965,517 B2 | * | 11/2005 | Wanes et al. ............... 361/760 |
| 6,987,656 B2 | * | 1/2006 | Nakamura et al. ......... 361/104 |
| 2001/0012708 A1 | * | 8/2001 | Mizuno et al. ............ 439/76.1 |
| 2001/0026430 A1 | * | 10/2001 | Onizuka et al. ............ 361/103 |
| 2002/0081905 A1 | * | 6/2002 | Nakamura et al. .......... 439/621 |
| 2004/0001319 A1 | * | 1/2004 | Kawakita et al. ........... 361/715 |

FOREIGN PATENT DOCUMENTS

JP A 2001-268785 9/2001

* cited by examiner

*Primary Examiner*—Dean A. Richard
*Assistant Examiner*—Hoa C. Nguyen
(74) *Attorney, Agent, or Firm*—Oliff & Berridge, PLC

(57) ABSTRACT

An integrated bus bar structure plate in which a plurality of bus bars are arranged on substantially the one plain face to form an electric power circuit, wherein after the bus bar structure plate having a whole shape in which a plurality of types of electric power circuits are formed by selecting any of the connection parts of the bus bars is separated is adhered to the control circuit board whereby, for example, a desired electric power circuit is formed among the connection parts of bus bars.

5 Claims, 12 Drawing Sheets

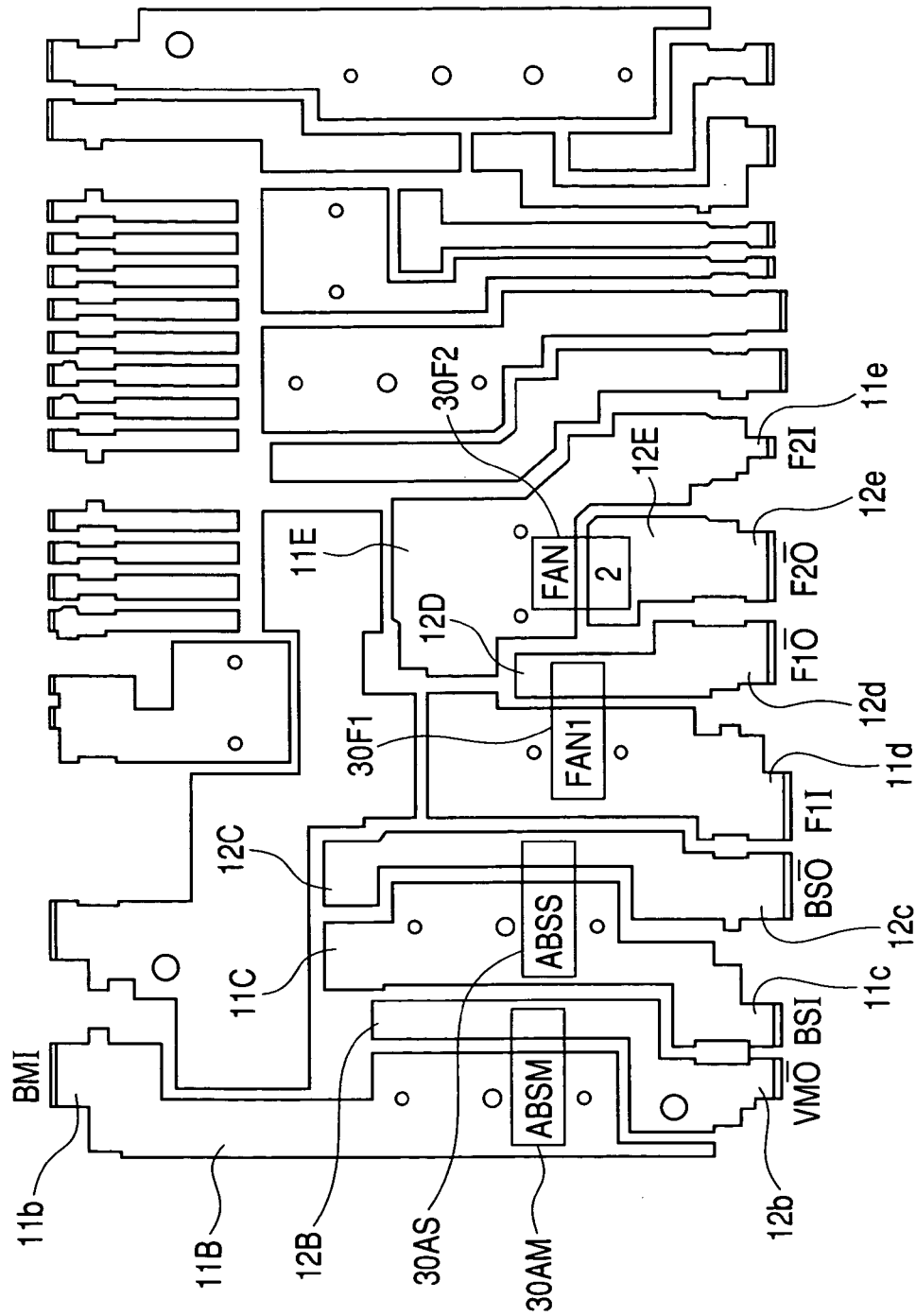

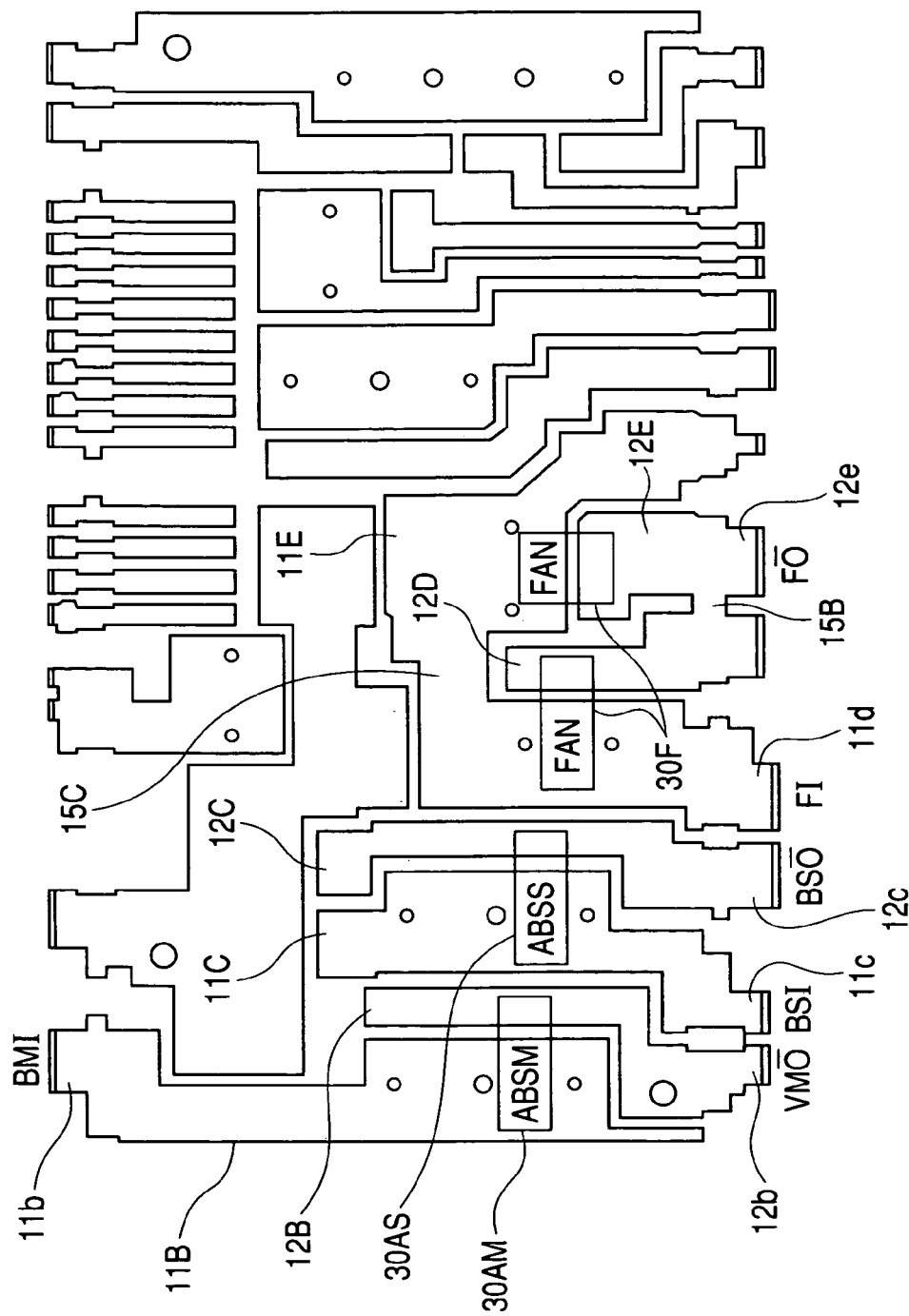

BUS BAR STRUCTURE PLATE AND PRODUCING METHOD OF CIRCUIT STRUCTURE BODY BY USING OF THE SAME

BACKGROUND OF THE INVENTION

1. Field of the Invention

The present invention relates to a technique for manufacturing a circuit structure body in which an electric power circuit has a plurality of bus bars.

2. Description of the Related Art

Conventionally, an electric connection box including a bus bar substrate has been well known as a circuit structure body forming an electric power circuit which is mounted in a vehicle. The bus bar substrate is structured such that a bus bar and an insulation plate are alternatively layered to form a distribution circuit for distributing electric power from a common in-vehicle power source to each electrical component so that a fuse and/or a relay switch are/is mounted at appropriate positions therein.

Further, a circuit structure body whose electric connection box is simplified and thin-shaped has been recently developed.

For example, JP-A-2001-268785 described below discloses a circuit structure body (which is referred to as a power distributor in the JP-A-2001-268785) forming bus bars for providing an electric power circuit (which is referred to as a distribution circuit in the JP-A-2001-268785) being arranged on a substantially plane face so that these bus bars are integrated by resin molding and semiconductor switching elements such as an FET are mounted at appropriate positions. This circuit structure body can be produced in such a manner that a bus bar structure plate in which the bus bars are integrated is stamped out of a single metal plate, the stamped plate is resin molded and positions at which the bus bars are connected are appropriately separated.

In the circuit structure body as set forth in JP-A-2001-268785, the electric power circuit composed of the bus bars is generally not commonly used for all vehicles, however, the circuit configuration is appropriately changed depending on vehicle type, grade, or destination, for example. In this case, a bus bar structure plate having different arrangement patterns must be produced for each change in the circuit configuration. Accordingly, as the types of electric power circuits are increased, the greater the number of production, lowering mass' production performance and thus hindering cost reductions.

SUMMARY OF THE INVENTION

It is an object of the invention to provide a technique for efficiently producing a plurality of circuit structure bodies forming different electric power circuits in an efficient manner.

The present invention provides a bus bar structure plate in which a plurality of bus bars are arranged on a substantially one plane face forming an electric power circuit and these bus bars are connected to provide an integrated whole shape, wherein the bus bar structure plate has a whole shape in which a plurality of types of electric power circuits are formed by selecting positions at which the bus bars are separated.

According to this bus bar structure plate, the type of electric power circuit to be finally formed can be changed by selecting the positions at which the bus bars are separated from each other included in the structure plate. Specifically, a plurality of types of electric power circuits can be selectively formed by separating an appropriate portion in a single type of bus bar structure plate used as a base, therefore, a plurality of types of circuit structure bodies can be mass-produced without a significant increase in production facilities.

Specifically, a circuit structure body is preferable wherein the specified portion of the bus bar structure plate for mounting a plurality of switching elements intervening in the electric power circuit at specified positions of the bus bar structure body, and the whole shape is set such that a circuit in which a plurality of switching elements to be mounted in the mounting portion are arranged in parallel and a circuit in which a plurality of switching elements to be mounted in the mounting portion are arranged in series are selectively formed by selecting positions at which the bus bars are separated from each other. According to this structure, a circuit in which a plurality of switching elements are arranged in parallel and a circuit in which a plurality of switching elements are arranged in series can be selectively formed by merely selecting the separating position in a single type of bus bar structure plate.

This bus bar structure enables the promotion of simplifying and thin-shaping of the entire circuit structure finally obtained by overlaying a control circuit board for controlling operation of the power circuit formed by the bus bars and the bus bar structure. In this case, a substrate adhesion region to which the control circuit board is adhered is set at a specified portion of the bus bar structure plate, and the bus bar structure plate has a configuration in which the bus bars are connected to each other outside of this substrate adhesion region, thereby performing efficient separation of the adhesion and bus bars from each other.

Specifically, according to a method including a step of producing the bus bar structure plate; a step of adhering the substrate adhesion region of the bus bar structure plate to the control circuit board for controlling the operation of the electric power circuit formed of the bus bars included in the bus bar structure plate; and a step of separating the specified bus bars after this adhesion step to form an electric power circuit, a plurality of bus bars are adhered to the control circuit board to improve production efficiency and an appropriate separating position is selected in the subsequent separation step, thus providing a desired electric power circuit.

The step of producing the bus bar structure plate includes a step of stamping the bus bar structure plate out of a single metal plate, for example, thereby allowing the production to be performed efficiently.

By a step after the adhesion step of mounting a switching element to both of the predetermined bus bars included in the bus bar structure and the control circuit board, the switching element is included in the electric power circuit and the circuit connected to the control circuit board can be provided in an easy manner.

BRIEF DESCRIPTION OF THE DRAWINGS

FIGS. 2A, 2B and 2C are plan views illustrating an example of a circuit pattern that can be obtained by the bus bar structure plate;

DESCRIPTION OF THE PREFERRED EMBODIMENTS

Embodiments of the present invention will be described with reference to the accompanying drawings. The bus bar structure plate 10 shown below is used to provide a distribution circuit for distributing electric power supplied from a common power source mounted in a vehicle or the like to a plurality of electric loads. However, the present invention is not limited to this. The present invention also can be widely applied to the production of a circuit structure body for providing an electric power circuit in which a plurality of bus bars are arranged on a substantially plane face.

Figure 1:
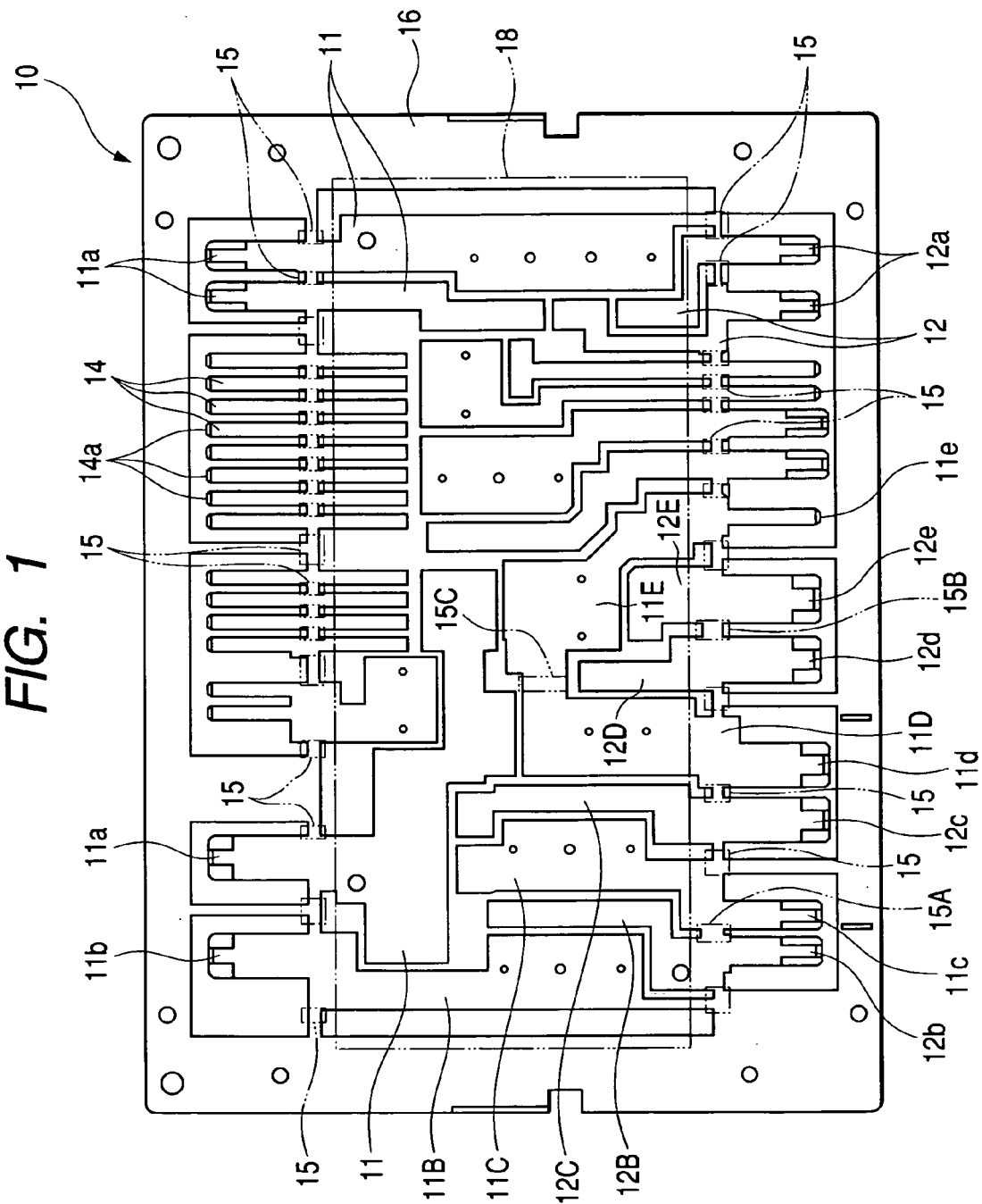
FIG. 1 is a plan view illustrating the bus bar structure plate according to an embodiment of the present invention.

The bus bar structure plate 1 shown in FIG. 1 has a rectangular-shaped outer frame 16. In a region inside of the outer frame 16, a large number of bus bars are arranged with a predetermined pattern. These bus bars include: a plurality of input bus bars 11 for providing an input terminal; a plurality of output bus bars 12 for providing an output terminal; and a plurality of signal input bus bars 14. A specific bus bar is connected to the outer frame 16 via the connection part 15 having a small width and adjacent bus bars are connected to each other via the connection part 15 having an appropriate shape, thereby providing an integrated whole. When a specified portion of the connection part 15 is separated, then the distribution circuit is structured.

In FIG. 1, the outer end section 11a of the input bus bar 11, the outer end section of the output bus bar 12a, and the outer end section 14a of the signal input bus bar 14 are a free end section that is adjacent to the inner edge of the outer frame 16 and that is not connected to the outer frame 16. Although this outer frame 16 may be omitted, when the outer frame 16 is connected with an appropriate bus bar, the entire bus bar structure plate 10 has an increased rigidity and can be handled in an easier manner (e.g., can be handled in an easier manner in an adhesion step (which will be described later)).

In the center area of this bus bar structure plate 10 in the width direction (in the up and down direction in FIG. 1), the rectangular-shaped substrate adhesion region 18 is provided to which the control circuit board 20 (which will be described later) is adhered. The substrate adhesion region 18 and the connection part 15 are provided to have a relative position such that the connection part 15 are protruded at both outer sides of this substrate adhesion region 18.

In addition to the normal input bus bar 11 and the output bus bar 12, this bus bar structure plate 10 also includes a plurality of input bus bars 11B, 11C, 11D, 11E and the output bus bars 12B, 12C, 12D, and 12E (four input bus bars and four output bus bars are provided in the drawing). These input and output bus bars are used for providing different electric power circuit parts depending on whether the connection part is separated or not.

Specifically, whether a) the connection part 15A between the output bus bar 12B and the input bus bar 11C, b) the connection part 15B between the output bus bars 12D and 12E, and C) the connection part 15C between the input bus bars 11D and 11E are separated or not is determined depending on the required structure of an electric power circuit. Thus, the combination of separation of these connection parts 15A, 15B, and 15C can be used to selectively provide the electric power circuits having the three patterns as shown in FIGS. 2A, 2B, and 2C, respectively.

These patterns will be described. First, the pattern shown in FIG. 2A shows a switching element included in an electric power circuit in which: (1) two first for-VSC FETs 30V1 (for stable control of vehicle) are provided in parallel between the input bus bar 11B and the output bus bar 12B; (2) two second for-VSC FETs 30V2 are provided in parallel between the input bus bar 11C and the output bus bar 12C; and (3) two for-fan FETs 30F are provided between the input bus bar 11D and the output bus bar 12D and between the input bus bar 11E and the output bus bar 12E, respectively. In this switching element, the connection parts 15A, 15B, and 15C are not separated at all to maintain the connection among the bus bars. This pattern provides the electric power circuit shown in FIG. 3.

Figure 2A:
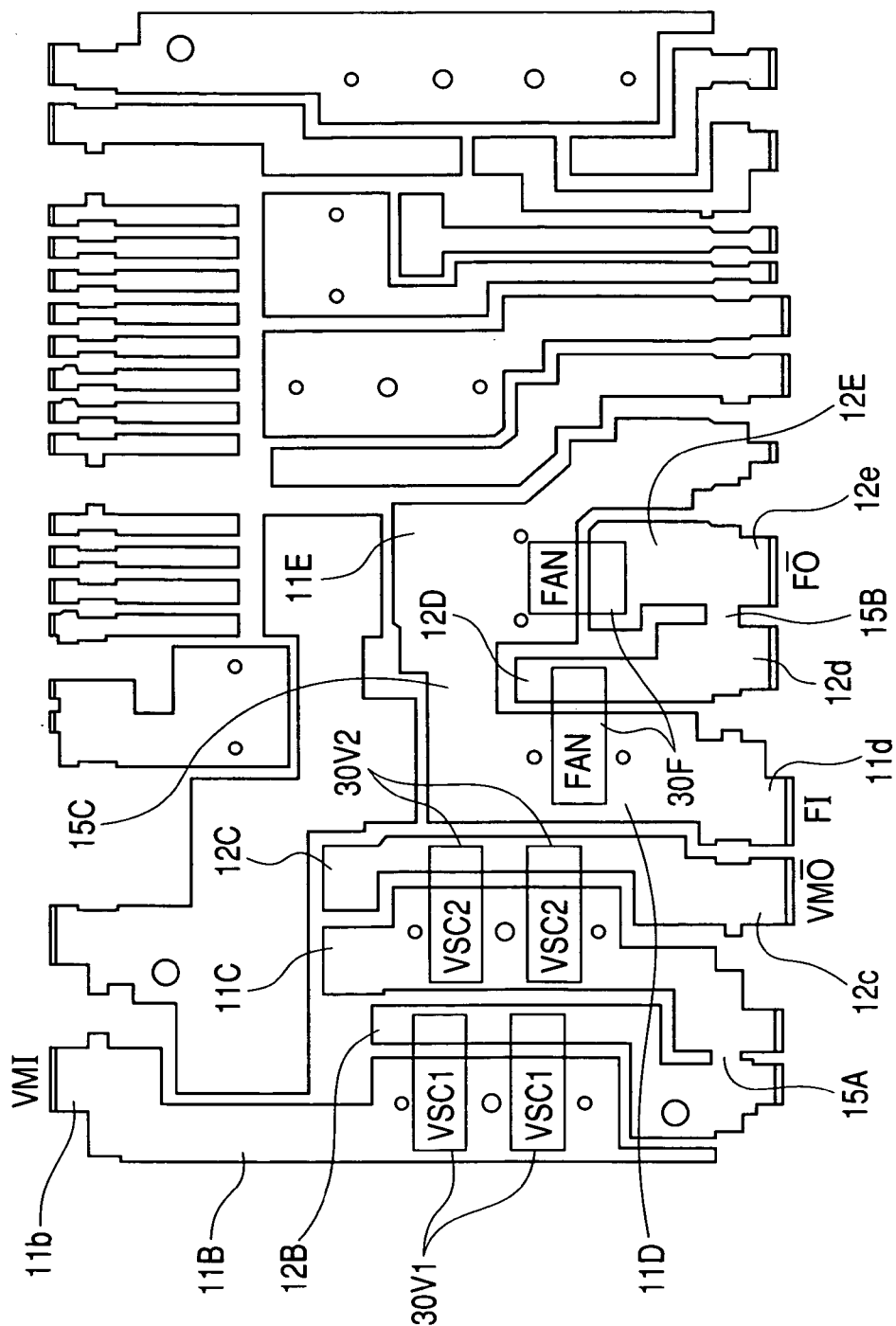
Figure 3:
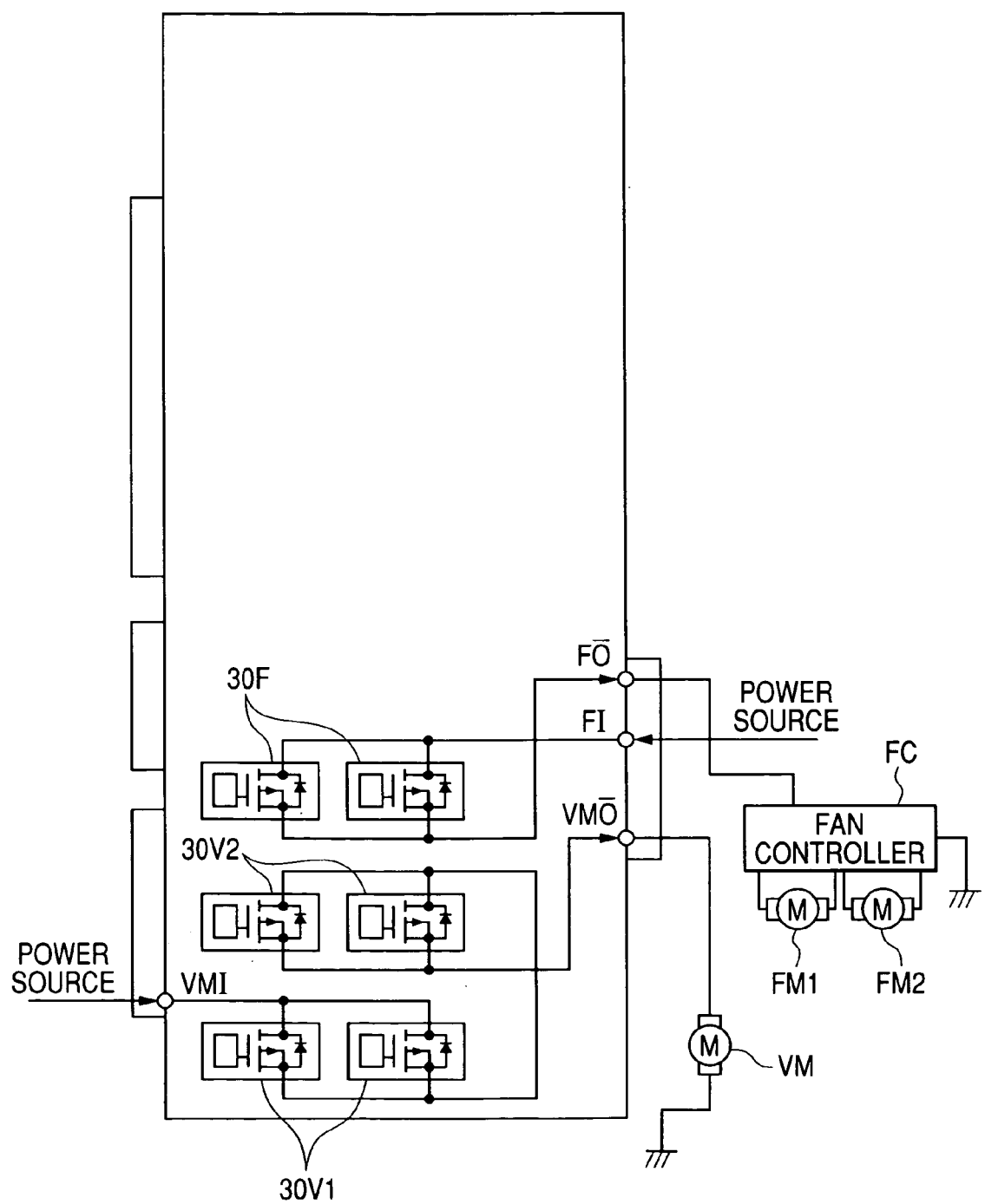
FIG. 3 is a circuit diagram illustrating the electric power circuit formed by the bus bar arrangement of FIG. 2A.

In these electric power circuits shown in FIG. 2A and FIG. 3, the end section 11b of the input bus bar 11B provides the for-VSC input terminal VMI that is connected to a power source (not shown) (e.g., in-vehicle battery); the end section 12c of the output bus bar 12C provides the for-VSC output terminal VMO that is connected to the VSC motor VM; and both terminals VMI and VMO have therebetween two first for-VSC FETs 30V1 and two second for-VSC FETs 30V2. The first for-VSC FET30V1 and the two second for-VSC FETs 30V2 are provided in parallel in order to secure the capacity. Each first for-VSC FET30V1 is used for a fail safe purpose for the emergency shutdown of the second for-VSC FET30V2 when any of the second for-VSC FETs 30V2 has a failure and thus is provided in the upstream side of the second for-VSC FET30V2 in series with the FET30V2.

The end section 11d of the input bus bar 11D provides the for-fan input terminal FI that is connected to a power source (not shown). The end section 12d of the output bus bar 12D provides the for-fan output terminal FO that is connected to the fan controller FC. Both terminals FI and FO have therebetween two for-fan FETs 30F provided in parallel. When power is supplied from the power source via both for-fan FETs 30F to the fan controller FC, two fan motors FM1 and FM2 provided in the radiator are driven in a controlled and integrated manner.

On the other hand, the pattern shown in the FIG. 2B shows a switching element included in an electric power circuit in which: (1) the FET30AM for an Anti Lock Brake System (ABS) motor is provided between the input bus bar 11B and the output bus bar 12B; (2) the FET30AS for the solenoid of ABS is provided between the input bus bar 11C and the output bus bar 12C; (3) the first for-fan FET30F1 is provided between the input bus bar 11D and the output bus bar 12D; and (4) the second for-fan FET30F2 is provided between the input bus bar 11E and the output bus bar 12E.

In this switching element, the connection parts 15A, 15B, and 15C are all separated to perfectly cut the connection among the bus bars. This pattern provides the electric power circuit shown in FIG. 4.

Figure 4:
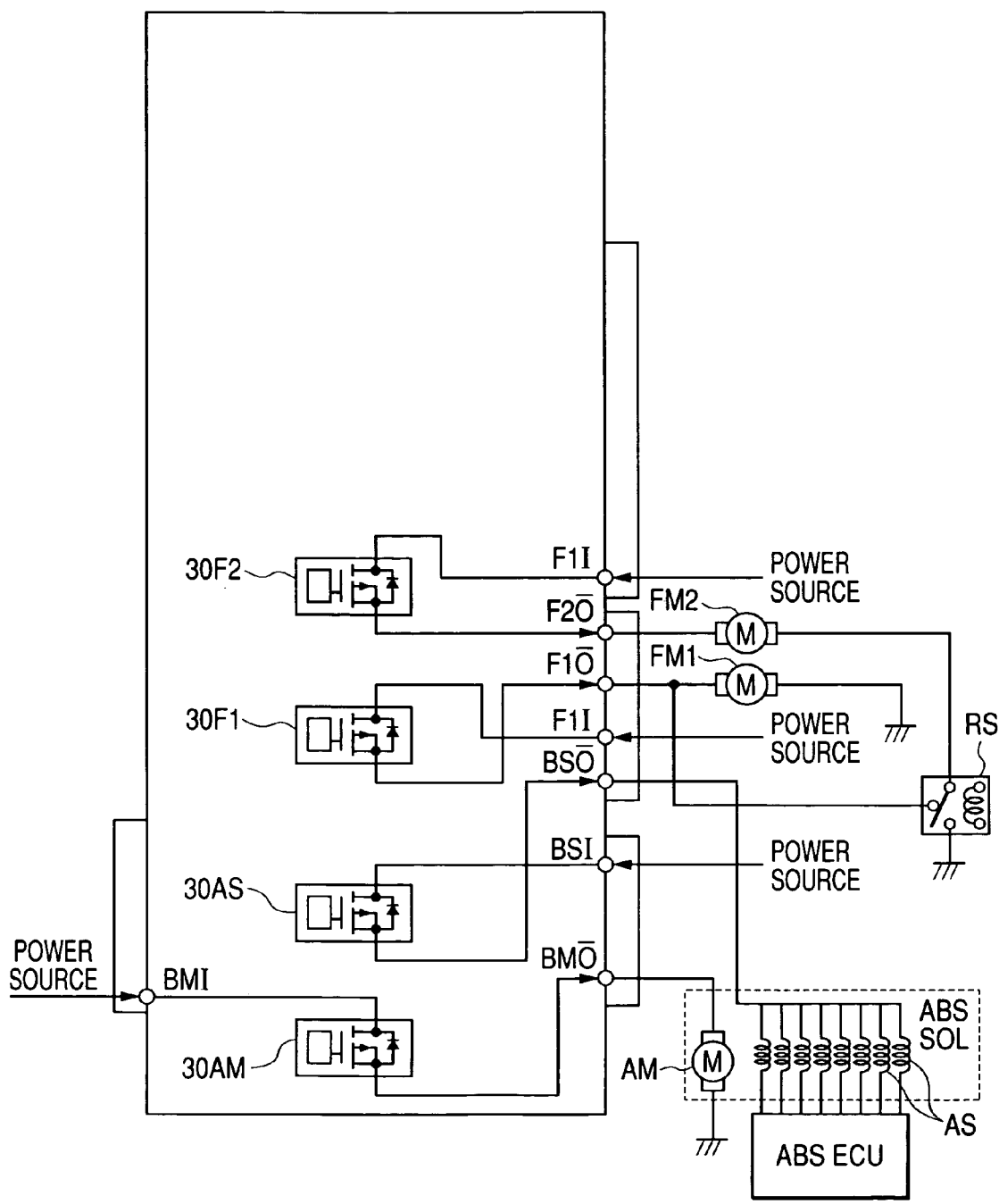
FIG. 4 is a circuit diagram illustrating the electric power circuit formed by the bus bar arrangement of FIG. 2B.

In these electric power circuits shown in FIG. 2B and FIG. 4, the end section 11b of the input bus bar 11B provides the for-ABS-motor input terminal BMI that is connected to a power source (not shown); the end section 12b of the output bus bar 12B provides the for-ABS-motor output terminal BMO that is connected to the for-ABS motor AM; and both terminals BMI and BMO have therebetween the for-ABS-motor FET30AM. Similarly, the end section 11c of the input bus bar 11C provides the for-ABS-solenoid output terminal BSI that is connected to a power source (not shown); the end section 12c of the output bus bar 12C provides the for-ABS-solenoid output terminal BSO that is connected to the for-ABS solenoid AS; and both terminals BSI and BSO have therebetween the for-ABS-solenoid FET30AS.

The end section 11d of the input bus bar 11D provides the first for-fan input terminal F1I that is connected to a power source (not shown); the end section 12d of the output bus bar 12D provides the first for-fan output terminal F1O that is connected to the first fan motor FM1; and both terminals F1I and F1O have therebetween the first for-fan FET 30F1. Similarly, the end section 11e of the input bus bar 11E provides the second for-fan input terminal F2I that is connected to a power source (not shown); the end section 12e of the output bus bar 12E provides the second for-fan output terminal F2O that is connected to the second fan motor FM2; and both terminals F2I and F2O have therebetween the second for-fan FET30F2.

In FIG. 4, "RS" represents a relay switch for switching the motors FM1 and FM2 between the mutually independent status and the in-series connection status.

In this way, the electric power circuits shown in FIG. 2B and FIG. 4 provide the brake control and/or the control of driving of a fan in an individual and hardware-like manner. On the other hand, the electric power circuits shown in FIG. 2A and FIG. 3 provide control in an integrated and software-like manner and thus have a higher grade than that of the former electric power circuit.

FIG. 2C shows a pattern in which only the connection part 15A among the connection parts 15A, 15B, and 15C is separated and the connection parts 15B and 15C are not separated. Depending on the pattern, a circuit using the combination of the circuit shown in FIG. 3 and the circuit shown in shown in FIG. 4 can be provided. Specifically, the pattern of FIG. 2C provides, as in the pattern shown in FIG. 2B, a distribution circuit in which the for-ABS-motor FET30AM and the for-ABS-solenoid FET30AS are provided between the power source and the for-ABS motor AM as well as between the power source and the for-ABS solenoid AS, respectively. The pattern of FIG. 2C also provides, as in the pattern shown in FIG. 2A, a distribution circuit in which the for-fan FETs 30F1 and 30F2 are provided between the power source and the for-fan motor FM1 as well as between the power source and the for-fan motor FM2, respectively.

As described above, with the bus bar structure plate 10 shown in FIG. 1, a plurality of electric power circuits can be selectively formed merely by determining whether or not the respective connection parts 15A, 15B, and 15C are separated, thereby preventing an increase in production facilities and maintaining a high mass-production performance.

Specifically, this bus bar structure plate 10 can be easily formed by stamping a single metal plate by a press apparatus having a shape corresponding to the whole shape shown in FIG. 1, for example.

Thereafter, 1) a step of producing this bus bar structure plate 10 is performed, a circuit structure body in which the distribution circuit is formed can easily be obtained by performing the next step, for example.

The following step will be described with reference to FIG. 5 to FIG. 12, however, these figures are for showing the outline of the steps and the details of the configuration of the bus bar structure plate 10 shown in the figure are not always the same as that of the bus bar structure plate 10 shown in FIG. 1.

2) Adhesion Step

Figure 5:
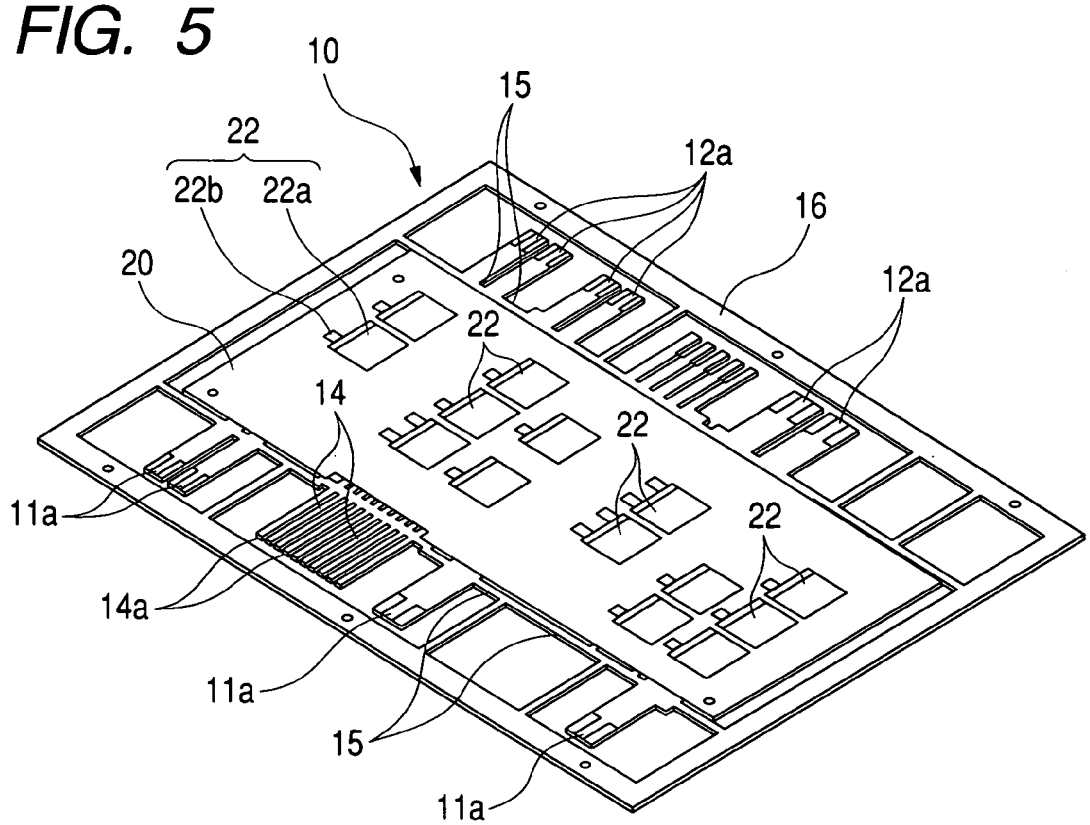
FIG. 5 is a perspective view illustrating the bus bar structure plate adhered to the control circuit board.
Figure 6:
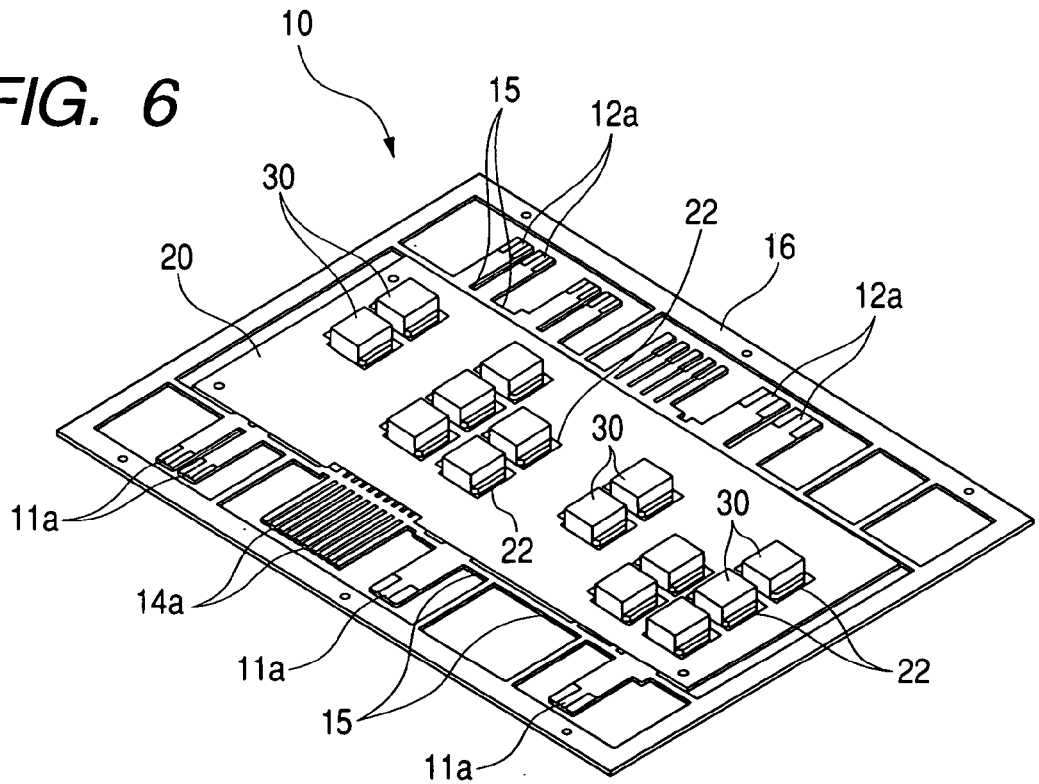
FIG. 6 is a perspective view illustrating the bus bar structure plate and the control circuit board to which an FET is mounted.

The one face of the control circuit board 20 is adhered to the substrate adhesion region 18 at the center of the bus bar structure plate 10 so as to form, thereby providing the structure as shown in FIG. 5.

This control circuit board 20 includes a control circuit for controlling the switching operation of the FET30 provided in the electric power circuit composed of bus bars as described later, for example, the control circuit board 20 can be composed of a normal printed-circuit board (i.e., a printed-circuit board in which conductors constituting a control circuit are printed-wired on an insulating substrate). In the illustrated example, the sheet-like control circuit board 20 having a very small thickness (e.g., 0.3 mm) is used in order to further reduce the entire thickness and to further improve the waterproofing property and a plurality of penetrated holes 22 are provided at appropriate positions of this control circuit board 20. This penetrated hole 22 is used for mounting the FET30 on a bus bar and details will be described later.

The control circuit board 20 has an outer shape that is smaller than that of the bus bar structure plate 10, the left and right widths of the substrate in particular are made sufficiently smaller than those of the bus bar structure plate 10 so as to be contained in the substrate plate adhesion region 18. When this control circuit board is adhered to the substrate adhesion region 18, whereby the end section 11a of the input bus bar 11 and the end section 14a of the signal input bus bar 14 are protruded from the bus bar structure plate 20 to the left outer side; the end section 12a of the output bus bar 12 is protruded to the right outer side; and all connection parts 15 are exposed to the outside of the control circuit board 20 (FIG. 5).

In order to adhere this control circuit board 20 to the bus bar structure plate 10, a method is effective in which the back face of the control circuit board 20 or the top face of the bus bar structure plate is coated with insulating adhesive agent by printing so as to form an insulation layer between the control circuit board 20 and each bus bar by this adhesive agent, for example. In a case the control circuit board 20 includes an electrically connected portion such as a through hole, the insulating adhesive agent must not be adhered to this portion.

3) Mounting Step

By use of the penetrated hole 22 provided in the control circuit board 20, the FET30 as a semiconductor switching element is mounted on both the control circuit board 20 and bus bar structure plate 10. In a case where the electric power circuit shown in FIG. 3 is formed, for example, this FET30 includes the for-VSC FETs 30V1 and 30V2 and the for-fan FET30F shown in FIG. 3. In a case where the electric power circuit shown in FIG. 4 is formed, for example, this FET30 includes the for-ABS FETs 30AM and 30AS and the for-fan FETs 30F1 and 30F2.

Figure 7:
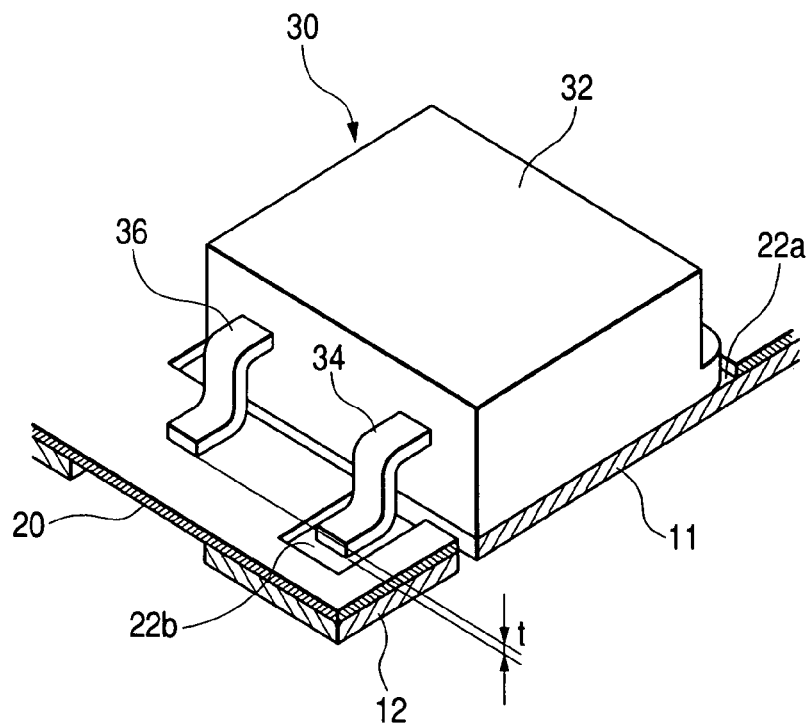
FIG. 7 is an enlarged cross sectional perspective view illustrating the mounting status of the FET.

As shown in FIG. 7, each FET30 includes: the substantial cuboid-like body 32; and at least three terminals (drain terminal, source terminal 34, and gate terminal 36 (not shown). Among the terminals, the drain terminal is provided on the back face of the body 32, the source terminal 34 and the gate terminal 36 are protruded from the side face of the body 32 to extend in the lower direction.

Corresponding to this FET30, each penetrated hole 22 of the control circuit board 20 includes the rectangular part 22*a* to which the body 32 of the FET30 can be inserted; and the extension part 22*b* that extends from this rectangular part 22*a* in a predetermined direction and that has a shape to which the source terminal 34 of the FET30 can be inserted. The drain terminal at the back face of the FET body 32 is allowed to have a direct contact with the upper face of the input bus bar 11 in the bus bar structure plate 10 via the rectangular part 22*a* so as to mount the FET body 32 on the bus bar 11; the source terminal 34 of the FET30 is connected via the extension part 22*b* to the output bus bar 12 to connect the gate terminal 36 of the FET30 to an appropriate conductor pattern on the control circuit board 20.

This mounting step can be easily performed merely by coating the interior of each penetrated hole 22 with molten solder by printing or the like and by mounting the FET30 thereon, for example.

Prior to this mounting step, it is more preferable that the step "t" having a thickness that is substantially the same as that of the control circuit board 20*b* is provided between the source terminal 34 and gate terminal 36, as shown in FIG. 7. Such a step allows, regardless of the thickness of the control circuit board 20, the terminals 34 and 36 to be mounted on the output bus bar 12 and the control circuit board 20, respectively, without causing both the terminals 34 and 36 to be deformed inappropriately, thereby remarkably reducing stress in each terminal after the mounting.

In a case where any bus bar which should be directly connected to the control circuit of control circuit board 20 (i.e., should be connected without via FET30), exists in bus bars included in the bus bar structure plate 10, soldering is performed on the bus bar and the control circuit board 20, for example.

4) Bending Step

Figure 8:
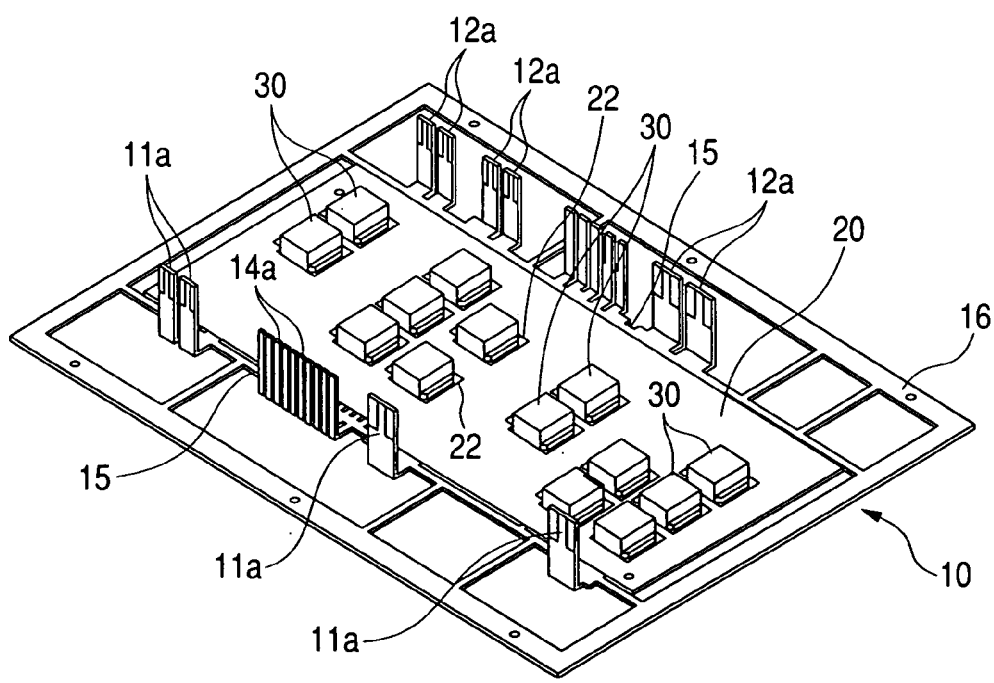
FIG. 8 is a perspective view illustrating the end section of the predetermined bus bar in the bus bar structure plate bent in an upward direction.
Figure 9:
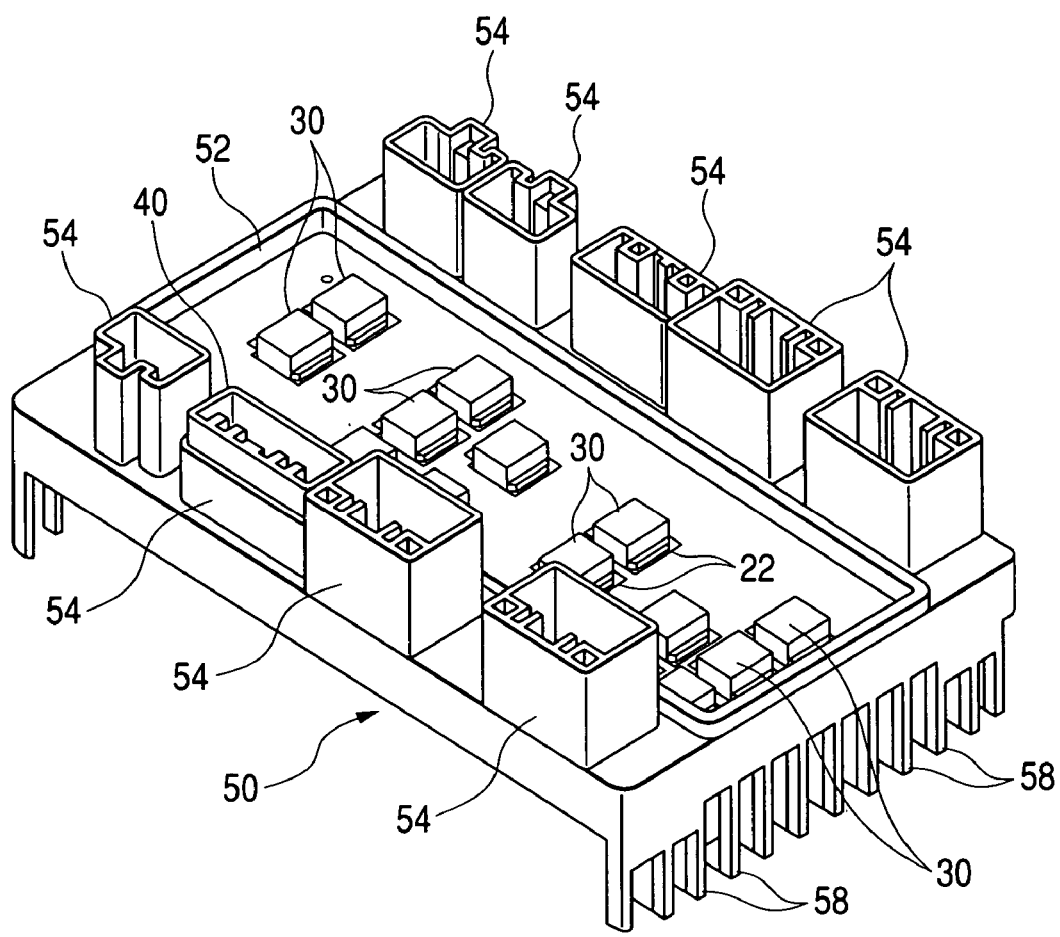
FIG. 9 is a perspective view illustrating the control circuit board and the bus bar mounted with the case.

As shown in FIG. 8, the end sections of the bus bars for constituting a terminal that is protruded from the control circuit board 20 at left and right sides are bent upward to form terminals connected to external circuits. By performing such a bending step, an external wiring member can be connected to each terminal from one direction, thus simplifying the connecting operation. This end section of the bus bar includes end sections shown in 11*a*, 12*a*, and 14*a* shown in FIG. 6 and as the end sections in the bus bar structure plate 10 shown in FIG. 1 (which are omitted in FIG. 6) includes bus bar terminals 11*b*, 11*c*, 11*d*, 11*e*, 12*b*, 12*c*, and 12*e*.

5) Separation Step

The connection part in the bus bar structure plate 10 (a connection part 15 of the bus bar structure plate 10 shown in FIG. 1 that is surrounded by a chain double-dashed line) is cut by pressing or the like to separate the bus bars from each other and to separate the bus bars and the outer frame 16, thereby forming an electric power circuit. Then, each connection part 15 is protruded from the control circuit board 20 toward the outside, therefore, the connection part 15 can be separated and the outer frame 16 can be removed in a smooth manner. On the other hand, as regards the connection parts 15A, 15B, and 15C shown in FIG. 1 and FIGS. 2A, 2B, and 2C, it has been described that by selecting whether or not these connection parts are separated, a plurality of types of electric power circuits can be provided from a single type of bus bar structure 10.

After this separation step, the entire height (thickness) is very small and the occupied area is limited to have a size equivalent to that of the control circuit board 20. This circuit structure body can be individually used, however, by adding a case 50 (described later) and a heat release member 60 thereto, waterproofing property and heat release performance can be improved, thus providing a circuit structure body that is suitable for a power distributor for vehicles or the like. Although this separation step may also be performed prior to the steps 3) to 5), by performing this separation step after the adhesion step, all bus bars and the control circuit board 20 can be adhered at the same time, thus remarkably improving production efficiency.

7) Case Mounting Step

The case 50 (FIG. 9) consisting of insulating material (e.g., synthetic resin) is covered on the circuit structure body obtained by 6) separation step from above. This case 50 has a shape that opens udnerneath to cover the whole of the control circuit board 20 from above, an opening which opens the FET30 upward at the center and a waterproofing wall 52 is installed upward at the periphery. Specifically, this waterproofing wall 52 includes a region including the FET30.

At the left and right end sections of this case 50 (left and right outer parts of the waterproofing wall 52), a plurality of cylindrical housings 54 having a opening upward and downward are formed. Each housing 54 individually surrounds the end section 11*a* of the input bus bar 11 (input terminal) and the end section 12*a* of output bus bar 12 (output terminal) to constitute a connector together with these terminals. From the front and rear end sections of the case 50, a plurality of fin covers 58 arranged at left and right sides are protruded downward.

8) Step of Connecting Heat Release Member

Figure 10:
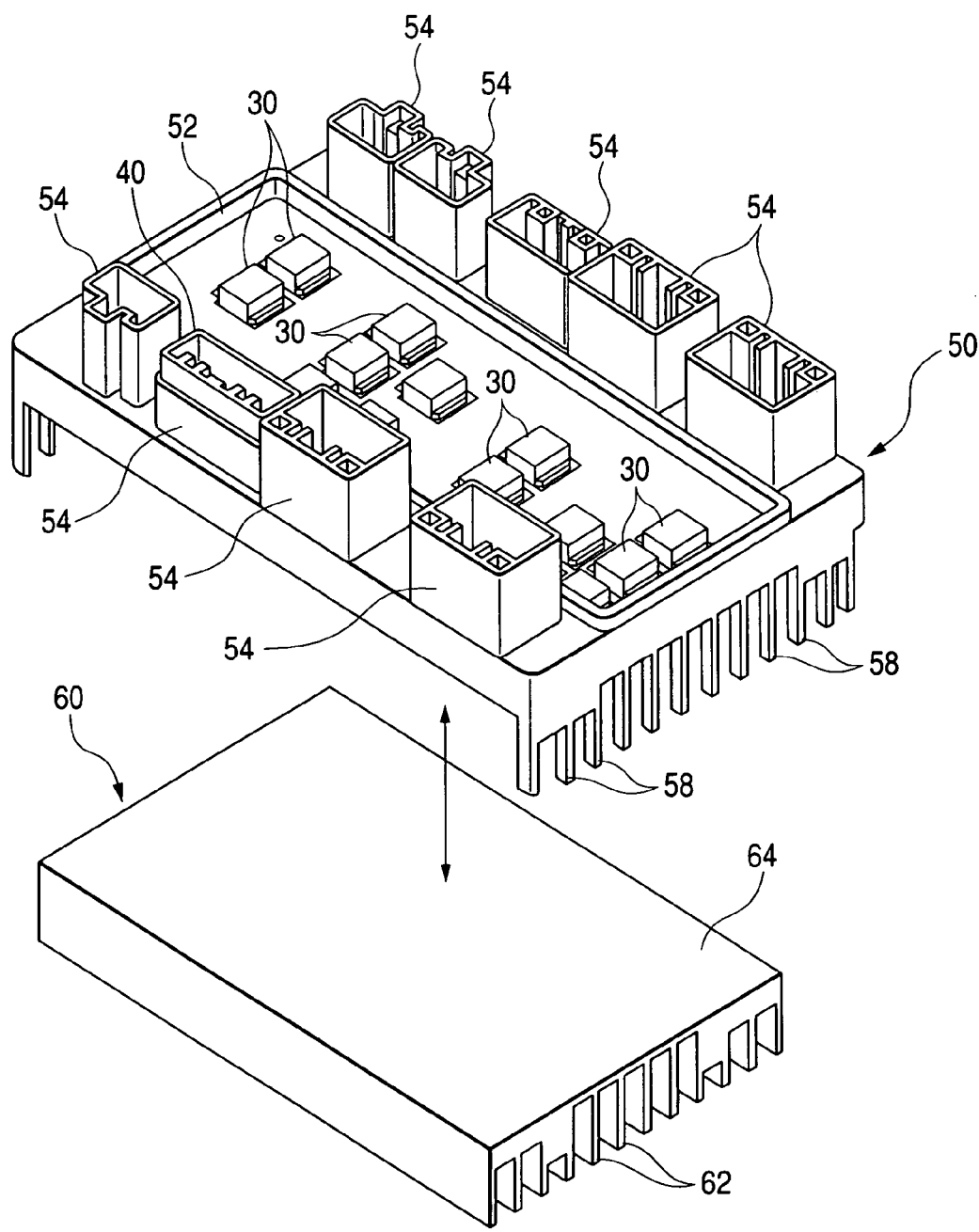
FIG. 10 is a perspective view illustrating the circuit structure body mounted with the case and the heat release member attached thereto.

In this step, the upper face 64 of the heat release member 60 is adhered to the lower face of each bus bar as shown in FIG. 10 so as to integrate the both members.

The heat release member 60 is formed of a material such as aluminum metal excellent in heat conductance and has a flat upper face 64, and a plurality of fins 62 arranged at left and right sides are protruded from the lower face. The position of each fin 62 corresponds to the position of the fin cover 58 in the case 50, and the heat release member 60 is mounted, thereby both longitudinal ends of each fin 62 are covered by the fin cover 58.

It is preferable that this heat release member 60 and the bus bar are adhered by the procedure as carried out below, for example.

(1) The upper face 64 of the heat release member 60 is coated with insulating adhesive agent consisting of epoxy resin and is dried, thereby forming a thin insulation layer.

(2) A material the same as the material constituting the insulating layer or a material softer than the material and excellent in heat conductivity (i.e., grease-like material such as a silicone adhesive agent) is coated on the above-described insulating layer, or the bus bar side is coated with an adhesive agent to adhere the bus bar with this adhesive agent.

9) Potting Step

Figure 11:
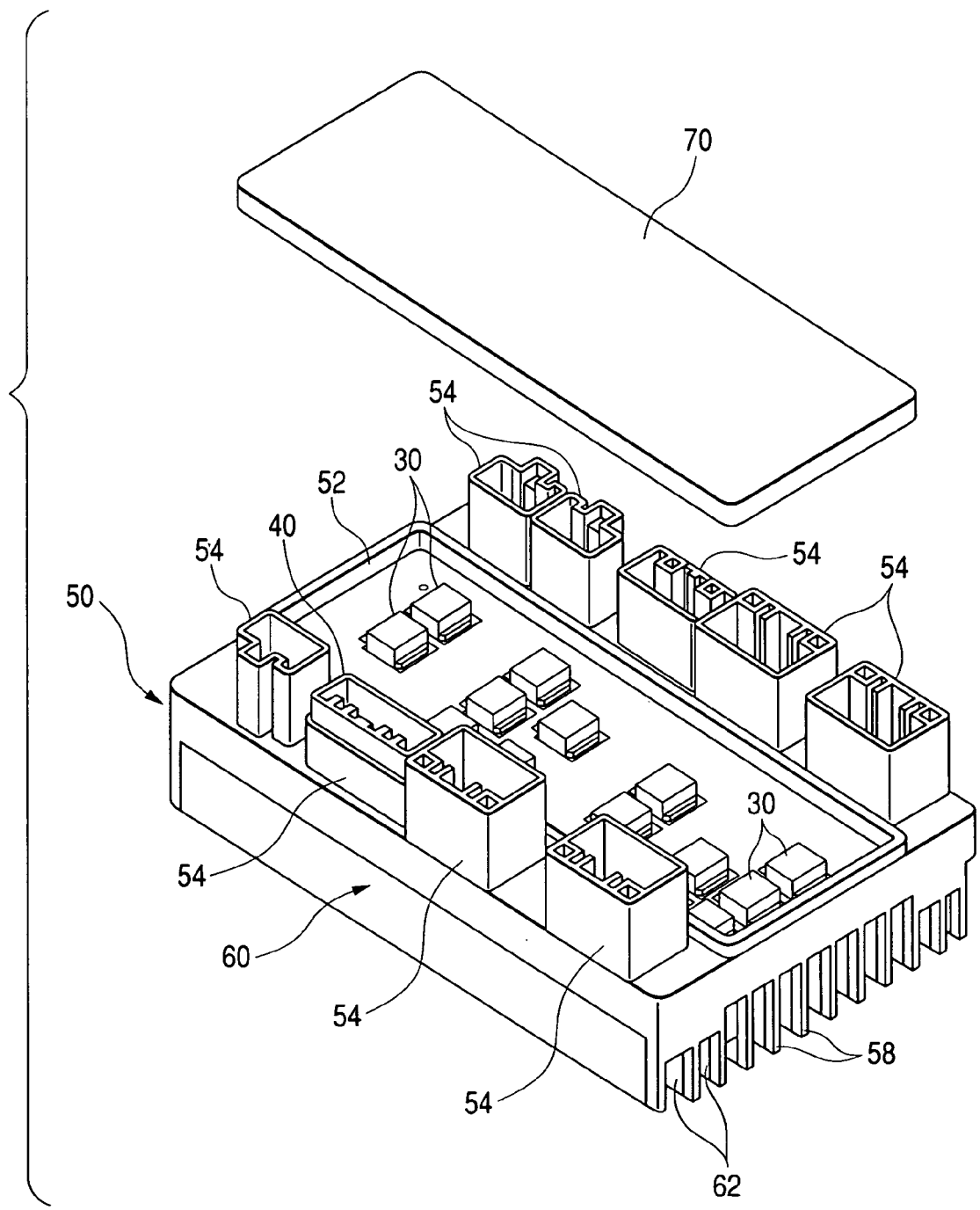
FIG. 11 is a perspective view illustrating the circuit structure body mounted with the heat release member and the cover mounted to the waterproofing wall of the case.
Figure 12:
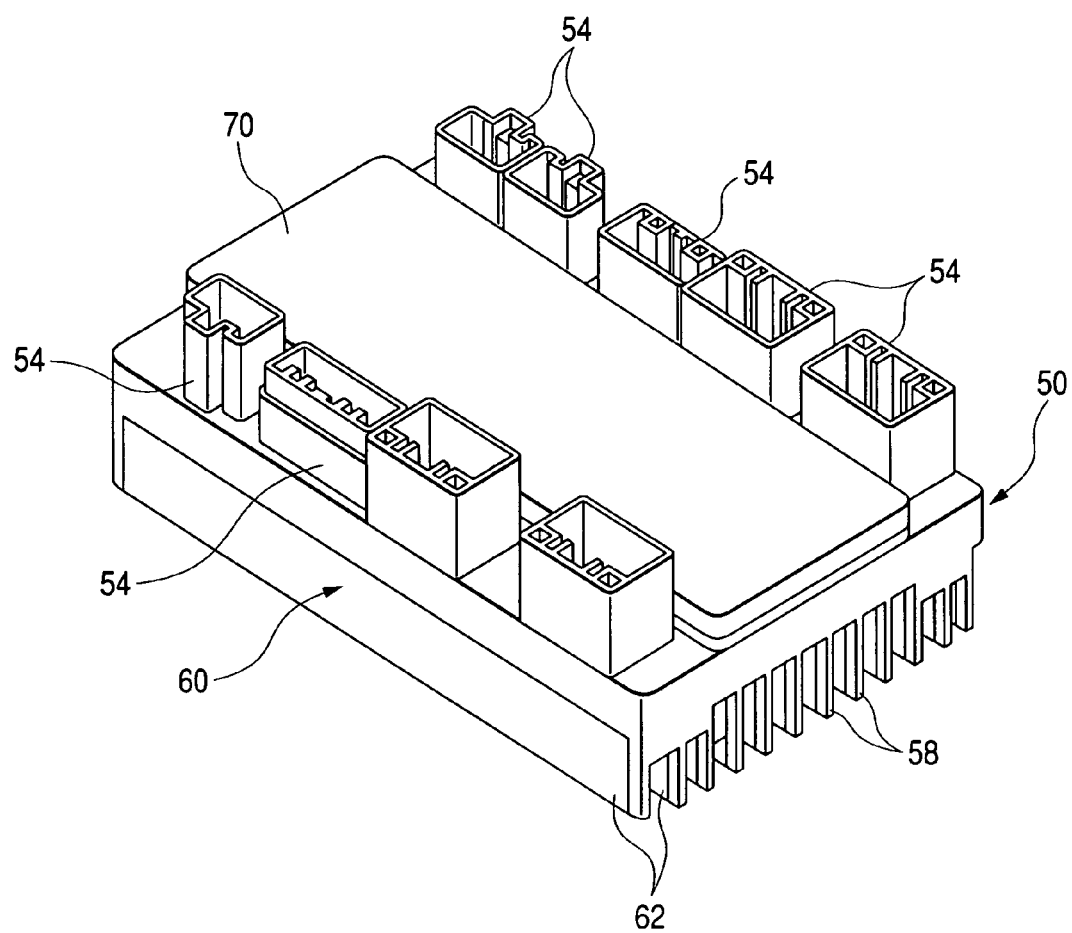
FIG. 12 is a perspective view illustrating the mounted cover.

The inner side of the waterproofing wall 52 is filled with a potting agent for promoting heat release. Thereafter, the upper end of the waterproofing wall 52 is covered with a cover 70 as shown in FIG. 11 to join both members (e.g., to vibration-weld them), thereby sealing and waterproofing the interior of the waterproofing wall 52 (FIG. 12).

As described above, the present invention is a bus bar structure plate in which a plurality of bus bars are arranged on substantially the one plane face. In this bus bar structure plate, a plurality of electric power circuits can be formed by selecting whether a specific connection part among the connection parts between the bus bars included in this structure plate is separated or not. This allows a single type of bus bar structure plate to form a plurality of types of electric power circuits. This provides an effect in which a plurality of types of circuit structure bodies can be produced in an efficient manner.

What is claimed is:

1. A bus bar structure plate, comprising:
   a plurality of bus bars arranged on one plane in an arrangement forming an electric power circuit, the bus bars being connected to each other to form an integrated whole shape, and
   at least one connection part, having a connecting portion, connecting at least one pair of adjacent bus bars,
   wherein the bus bar structure plate has the integrated whole shape in which a plurality of electric power circuits are formed by selecting at least one connection part at which a pair of adjacent bus bars are separated from each other, and
   a substrate adhesion region to which a control circuit board for controlling operation of the electric power circuit formed of the bus bars is adhered is set at a predetermined position, and the substrate adhesion region has such a shape that the connection part is positioned outside the substrate adhesion region in plan view.

2. A method for forming an electric power circuit, comprising the steps of:
   preparing the bus bar structure according to claim 1; and
   selecting a connecting portion of the bus bars requiring to separate the connecting portion in order to form a desired electric power circuit.

3. A method for producing a circuit structure body, comprising the steps of:
   preparing the bus bar structure plate according to claim 1;
   adhering the control circuit board formed of the bus bars included in the bus bar structure to the substrate adhesion region of the bus bar structure plate;
   selecting a connecting portion of the bus bars requiring to separate the connecting portion in order to form a desired electric power circuit after adhering the control circuit board; and
   separating the connecting portion.

4. The method for producing a circuit structure body according to claim 3, further comprising the step of:
   stamping the bus bar structure plate out of a single metal plate in the step of preparing the bus bar structure.

5. The method for producing a circuit structure body according to claim 3, further comprising the step of:
   mounting a switching element to both of predetermined bus bar of the bus bar structure and the control circuit board after adhering the control circuit board.

* * * * *